United States Patent
Chu et al.

(10) Patent No.: US 8,175,012 B2
(45) Date of Patent: May 8, 2012

(54) DECODING/ENCODING METHOD FOR BOOTING FROM A NAND FLASH AND SYSTEM THEREOF

(75) Inventors: Chin-Huo Chu, Kao-Hsiung Hsien (TW); Horng-Yi Chang, Taipei (TW); Jia-Horng Shieh, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 541 days.

(21) Appl. No.: 12/411,403

(22) Filed: Mar. 26, 2009

(65) Prior Publication Data

US 2010/0251074 A1 Sep. 30, 2010

(51) Int. Cl.
*H04B 7/005* (2006.01)
*H04B 1/44* (2006.01)
*H04L 12/28* (2006.01)
*G06F 13/00* (2006.01)
*G06F 9/00* (2006.01)

(52) U.S. Cl. .......... 370/278; 370/282; 370/395.2; 711/103; 713/2

(58) Field of Classification Search ........... 370/278, 370/282, 292; 711/103, 165; 713/1, 2; 714/5.1, 714/6.1, 6.11, 36, 763, 773, 786
See application file for complete search history.

(56) References Cited

U.S. PATENT DOCUMENTS

| | | | |
|---|---|---|---|
| 7,061,804 B2 * | 6/2006 | Chun et al. | 365/185.17 |
| 7,234,052 B2 | 6/2007 | Lee et al. | |
| 7,555,678 B2 * | 6/2009 | Lai et al. | 714/36 |
| 7,652,920 B2 * | 1/2010 | Seta et al. | 365/185.09 |
| 8,086,788 B2 * | 12/2011 | Randell et al. | 711/103 |
| 2005/0268077 A1 * | 12/2005 | Kuan et al. | 713/1 |
| 2007/0174602 A1 * | 7/2007 | Kao | 713/2 |
| 2009/0049364 A1 * | 2/2009 | Jo et al. | 714/763 |
| 2010/0020619 A1 * | 1/2010 | Sato | 365/185.24 |
| 2010/0312954 A1 * | 12/2010 | Jeon et al. | 711/103 |

* cited by examiner

*Primary Examiner* — Tri H Phan
(74) *Attorney, Agent, or Firm* — Winston Hsu; Scott Margo

(57) ABSTRACT

A decoding method for booting from a NAND Flash including a booting page storing a plurality of copies of NAND booting information and a plurality of corresponding parities, each parity generated by an predetermined error correction code (ECC) bit number. The decoding method includes reading the booting page, for obtaining a plurality of configuration data and a plurality of ECC data, and performing a voting scheme and an ECC decoding process on the plurality of configuration data and the plurality of ECC data, for obtaining the NAND booting information. Besides, an encoding method for encoding such booting information is disclosed the same.

20 Claims, 9 Drawing Sheets

DECODING/ENCODING METHOD FOR BOOTING FROM A NAND FLASH AND SYSTEM THEREOF

BACKGROUND OF THE INVENTION

The present invention relates to a decoding/encoding method for booting from a NAND Flash and a system thereof, and more particularly, to a decoding method and a system thereof for reading data which are previously written into the NAND Flash as duplicates of NAND booting information, and performing a voting scheme on the read data, for obtaining the NAND booting information, and thereof, an encoding method corresponding the same.

NAND Flash memory has many advantages such as high throughput, fast erasing time and the cost per Byte is much lower than NOR architecture-based Flash memories, and therefore is becoming an ideal solution for Personal Digital Assistant (PDA) and mobile phone platforms that require a large storage capacity for Operating System (OS) images and multimedia objects such as MP3 files. NAND Flash memory is a non-XIP (Execution in Place) memory, and therefore has to shadow codes to an XIP memory (e.g. a RAM) before booting from NAND Flash memory.

The NAND Flash array is grouped into a series of blocks, which are the smallest erasable units in a NAND Flash device. For example, a 2 Gb NAND Flash device is organized as 2,048 blocks, with 64 pages per block. Each page is 2,112 bytes, consisting of a 2,048-byte data area and a 64-byte spare area. The spare area is typically used for error correction code (ECC) for ensuring data integrity, wear-leveling and other software overhead functions. Please refer to FIG. 1, which is a schematic diagram of two conventional implementations for storing data and spare information in the same page according to the prior art. The FIG. 1(a) shows a first implementation of a 2,112-byte page containing four of these 528-byte elements, each involving a data area of 512 bytes plus the 16-byte spare area directly adjacent to it. The FIG. 1(b) shows a second implementation of storing the data and spare information separately. The four 512 byte data area are stored first, and their corresponding 16-byte spare area follow, in order, at the end of the page.

In addition, the current NAND Flash manufacturing includes a traditional single-level cell (SLC) technology, which can store only 1 bit of data per cell, and a multi-level cell (MLC) technology, which can store at least 2 bits of data per cell. Compared with SLC, MLC technology offers obvious density advantages but lacks the speed and reliability. An SLC NAND Flash uses simple Hamming code to correct a single bit error. However, from SLC to MLC NAND Flash, the ECC bit number is getting large, which increases the complexity of booting from NAND Flash.

When the system does not know what type the NAND Flash is, the system will first read the NAND Flash according to a setting of NAND booting information such as page size, address cycle, bus interface, ECC bit number, etc., from a booting page of a block 0 of the NAND Flash. If the used setting is incorrect and the ECC check is unsuccessful, the system will keep trying another setting of NAND booting information until successfully booting from the NAND Flash. For a NAND Flash with a page size equal to 4 KB, the iterations of its ECC bit number include 4, 6, 8, 10 and 12 bits. That is, the system may have to try 5 times at most for successfully booting from the NAND flash, not including trying another settings such as page size or address cycle.

On the other hand, in the booting page, NAND booting information occupies about 50 bytes. Please refer to FIG. 1 again, if the NAND Flash uses the first implementation as shown in FIG. 1(a), the system can only check the corresponding parity in the spare area after reading a data area of 512 bytes. Or, if the NAND Flash uses the second implementation as shown in FIG. 1(b), the system can only check the corresponding parity in the spare area after reading four data area of 512 bytes, which takes long time.

From the above, in the conventional booting method, the system may have to try a great deal of setting of NAND booting information to find out a suitable one. In addition, even if the NAND booting information only occupies a small part of the data area, the system still has to read the whole data area and the spare area and then can perform ECC check.

SUMMARY OF THE INVENTION

According to an embodiment of the present invention, a decoding method for booting from a NAND Flash is disclosed. The NAND Flash comprises a booting page storing a plurality of copies of NAND booting information and a plurality of corresponding parities, each parity generated by a predetermined error correction code (ECC) bit number. The decoding method comprises reading the booting page, for obtaining a plurality of configuration data and a plurality of ECC data, and performing a voting scheme and an ECC decoding process on the plurality of configuration data and the plurality of ECC data, for obtaining the NAND booting information.

According to an embodiment of the present invention, a booting information encoding method for a NAND Flash is disclosed. The encoding method comprises encoding NAND booting information according to a predetermined error correction code (ECC) capability, for generating a parity corresponding to a predetermined ECC bit number, duplicating the NAND booting information and the parity, for generating a plurality of NAND booting information and a plurality of parities, and writing the plurality of NAND booting information and the plurality of parities into a booting page of the NAND Flash.

According to an embodiment of the present invention, a booting method for booting from a NAND Flash is disclosed. The NAND Flash comprises a booting page storing a plurality of copies of NAND booting information and a plurality of parities, each parity corresponding to the NAND booting information and corresponding to an error correction code (ECC) bit number. The booting method comprises setting a page size and an address cycle for accessing the NAND Flash, performing a decoding process for obtaining NAND booting information, checking validation of the NAND booting information, changing settings of the page size and the address cycle when the NAND booting information is invalid, and performing the decoding process until the NAND booting information is valid. The decoding process comprises reading the booting page, for obtaining a plurality of configuration data and a plurality of ECC data, and performing a voting scheme and an ECC decoding process on the plurality of configuration data and the plurality of ECC data, for obtaining the NAND booting information.

According to an embodiment of the present invention, a boot control system for booting from a NAND Flash is disclosed. The NAND Flash comprises a booting page storing a plurality of copied of NAND booting information and a plurality of parities, each parity corresponding to the NAND booting information and corresponding to an error correction code (ECC) bit number. The boot control system comprises a processing unit, a NAND flash controller and an ECC engine. The processing unit is utilized for performing steps of setting a page size and an address cycle for accessing the NAND Flash, performing a voting scheme on the plurality of configuration data and the plurality of ECC data, for obtaining the NAND booting information, checking validation of the NAND booting information, and changing setting of the page size and the address cycle when the NAND booting information is invalid. The NAND flash controller is coupled to the NAND flash and the processing unit, and is utilized for performing steps of reading the booting page, for obtaining a plurality of configuration data and a plurality of ECC data. The ECC engine is coupled to the processing unit and the NAND Flash controller, and is utilized for performing an ECC decoding process, for obtaining the NAND booting information.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . . " Also, the term "couple" is intended to mean either an indirect or direct electrical connection. Accordingly, if one device is coupled to another device, that connection may be through a direct electrical connection, or through an indirect electrical connection via other devices and connections.

The present invention aims to provide a decoding process 20 for a system which uses a NAND Flash and wants to boot from the NAND Flash. The system can be a mobile phone platform, a portable electronic device, a computer, a multimedia platform, or an electronic device using the NAND Flash for large storage capacity, for example.

Please note that NAND booting information of the NAND Flash, such as a page size, an address cycle, a bus interface and an error correction code (ECC) bit number, are encoded and written into the NAND Flash according to another embodiment of the present invention, an encoding process 60, which will be described later. After performing the encoding process 60, a booting page of the NAND flash will store a plurality of NAND booting information and a plurality of parities, each parity corresponding to the NAND booting information and corresponding to an ECC bit number, including 4, 6, 8, 10 and 12 bits, etc. In one embodiment, the ECC bit number should use the largest one to make sure all kinds of ECC can be decoded. In other words, the booting page stores duplicates of NAND booting information and the corresponding parity.

Figure 1:
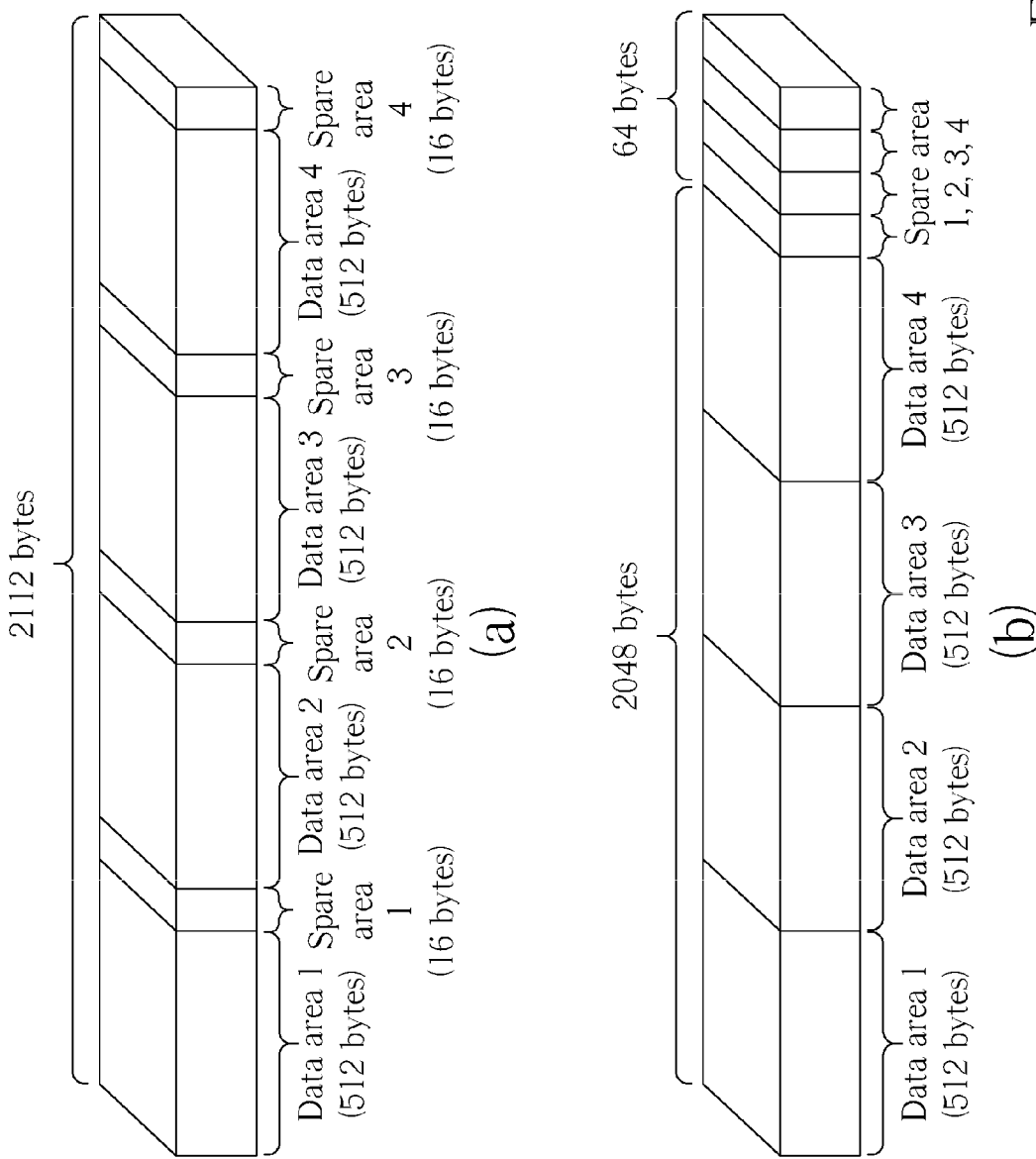
FIG. 1 is a schematic diagram of two conventional implementations for storing data and spare information in the same page according to the prior art.
Figure 2:
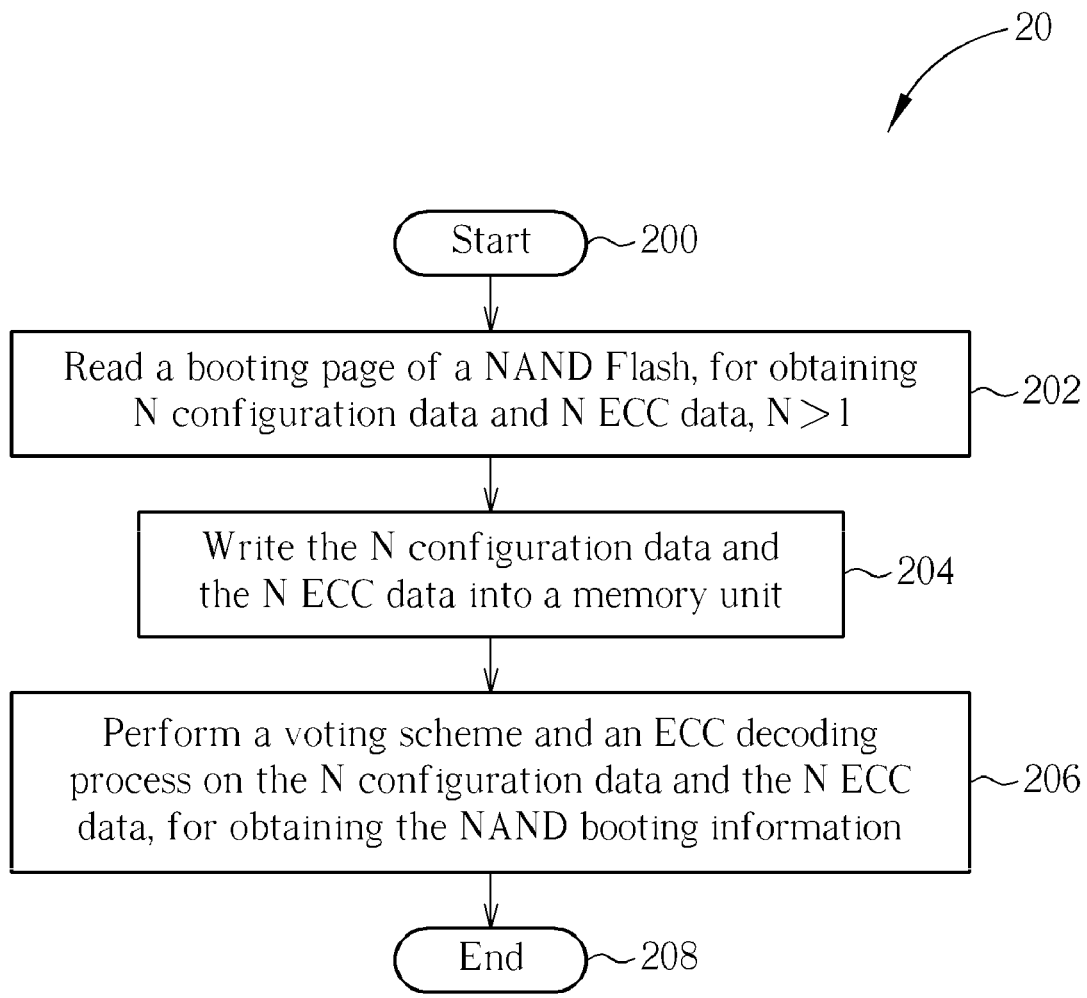
FIG. 2 to FIG. 5 are flowcharts of decoding processes according to embodiments of the present invention.

Please refer to FIG. 2, which is a flowchart of the decoding process 20 according to an embodiment of the present invention. The decoding process 20 comprises the following steps:

Step 200: Start.

Step 202: Read a booting page of a NAND Flash, for obtaining N configuration data and N ECC data, N>1.

Step 204: Write the N configuration data and the N ECC data into a memory unit.

Step 206: Perform a voting scheme and an ECC decoding process on the N configuration data and the N ECC data, for obtaining the NAND booting information.

Step 208: End.

The booting page is usually in the block 0. In the decoding process 20, the system first reads the booting page, for obtaining the configuration data and the ECC data. The configuration data are the NAND booting information with bits error generated when performing data transmission, and the ECC data are the parity with bits error generated when performing data transmission. Next, the system writes the N configuration data and the N ECC data into the memory unit in the system. The NAND Flash is a non-XIP memory so that the memory unit may be a RAM memory. Note that in another embodiment of the present invention, step 204 may not exist because the system can also read the booting page by a given address and perform the following steps without storing the N configuration data and the N ECC data into the memory unit.

At last, the system performs the voting scheme and the ECC decoding process on the N configuration data and the N ECC data, for obtaining the NAND booting information. The voting scheme is preferably a majority voting scheme. According to the decoding process 20, the system does not require taking a lot of time to try iterations of ECC bit number of the NAND Flash when booting from the NAND Flash. Moreover, the system can perform step 206 in different ways. In a brief, the system may perform the majority voting scheme first and perform the ECC decoding process later, or perform the ECC decoding process first.

Figure 3:
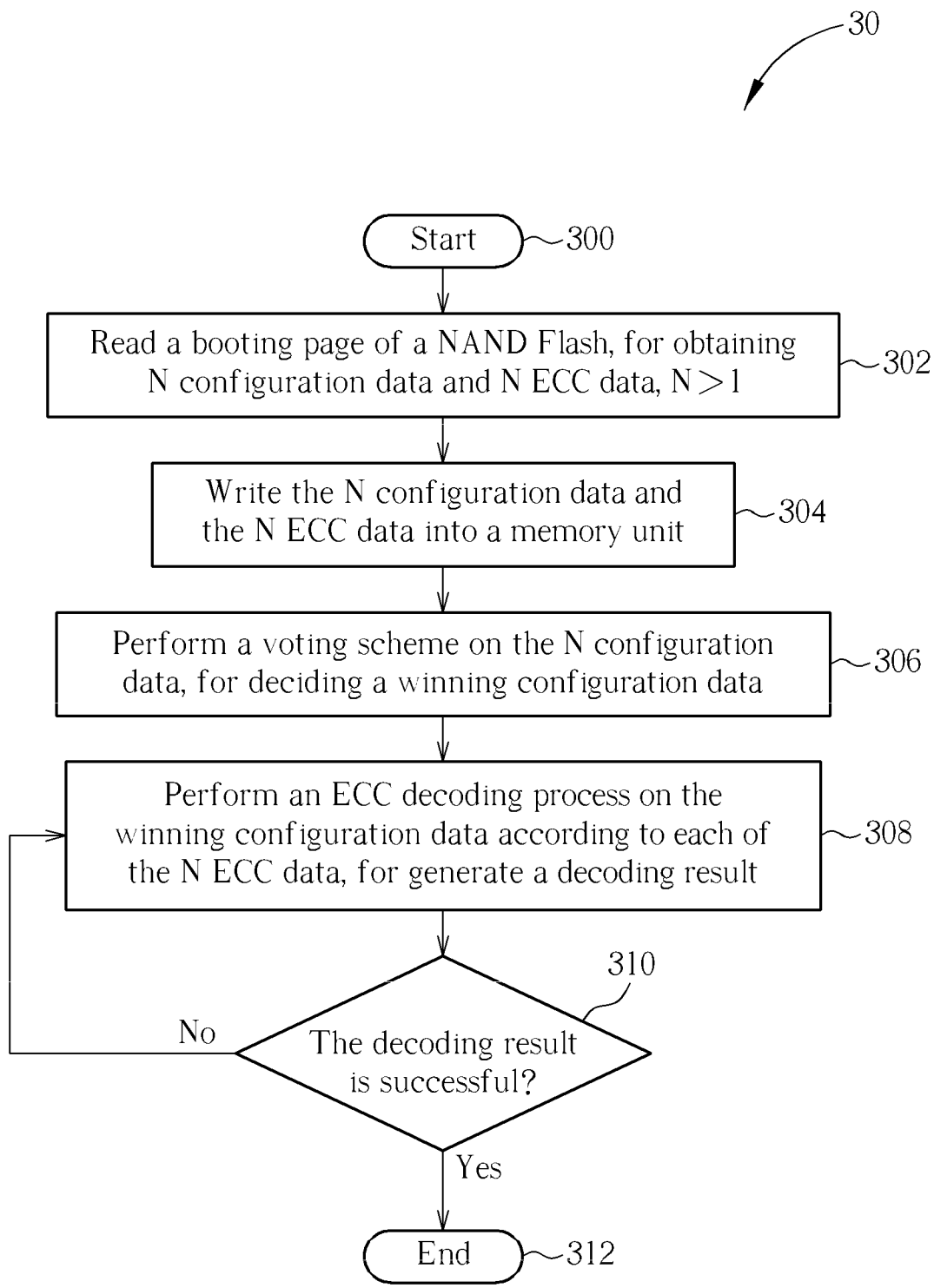
Figure 4:
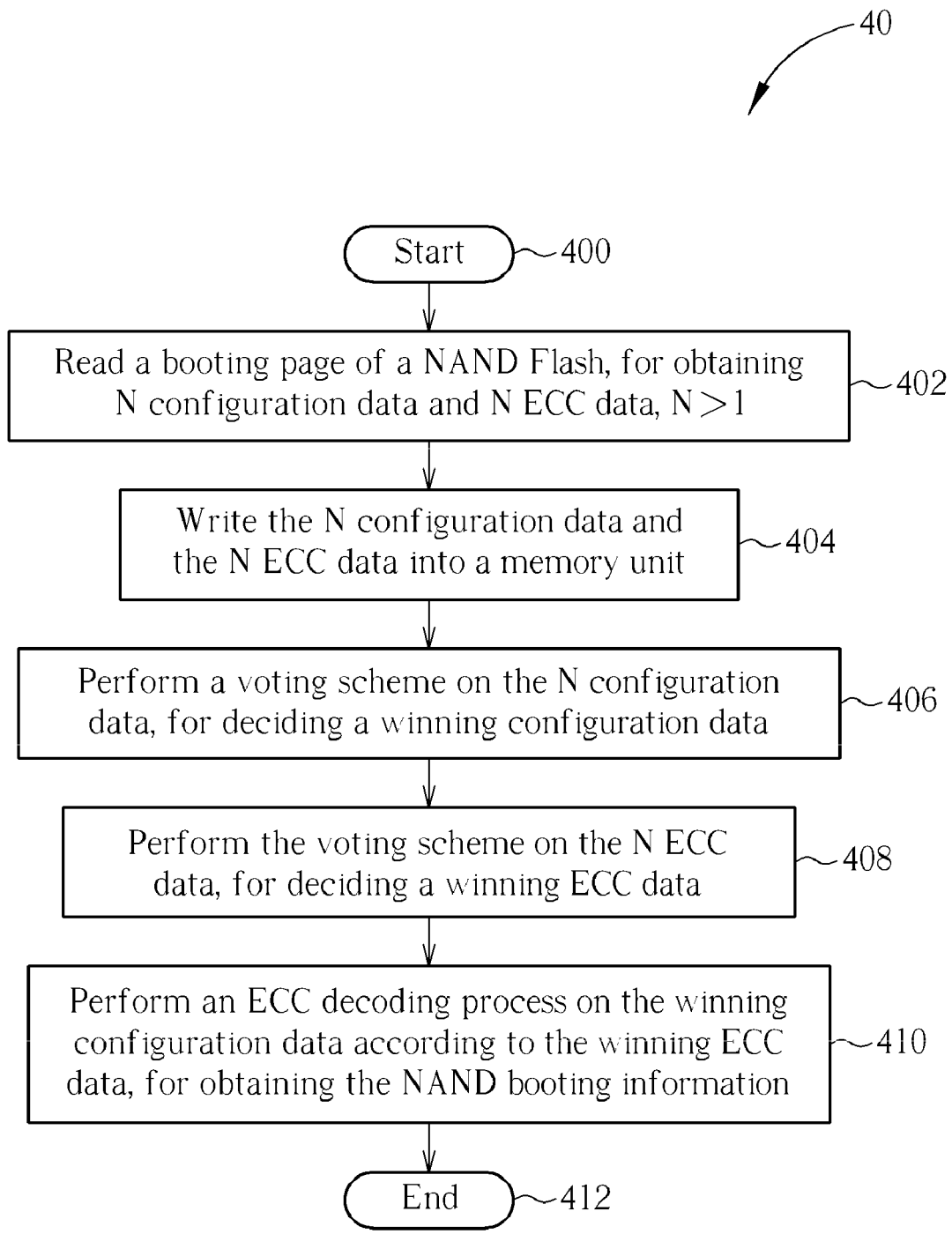
Figure 5:
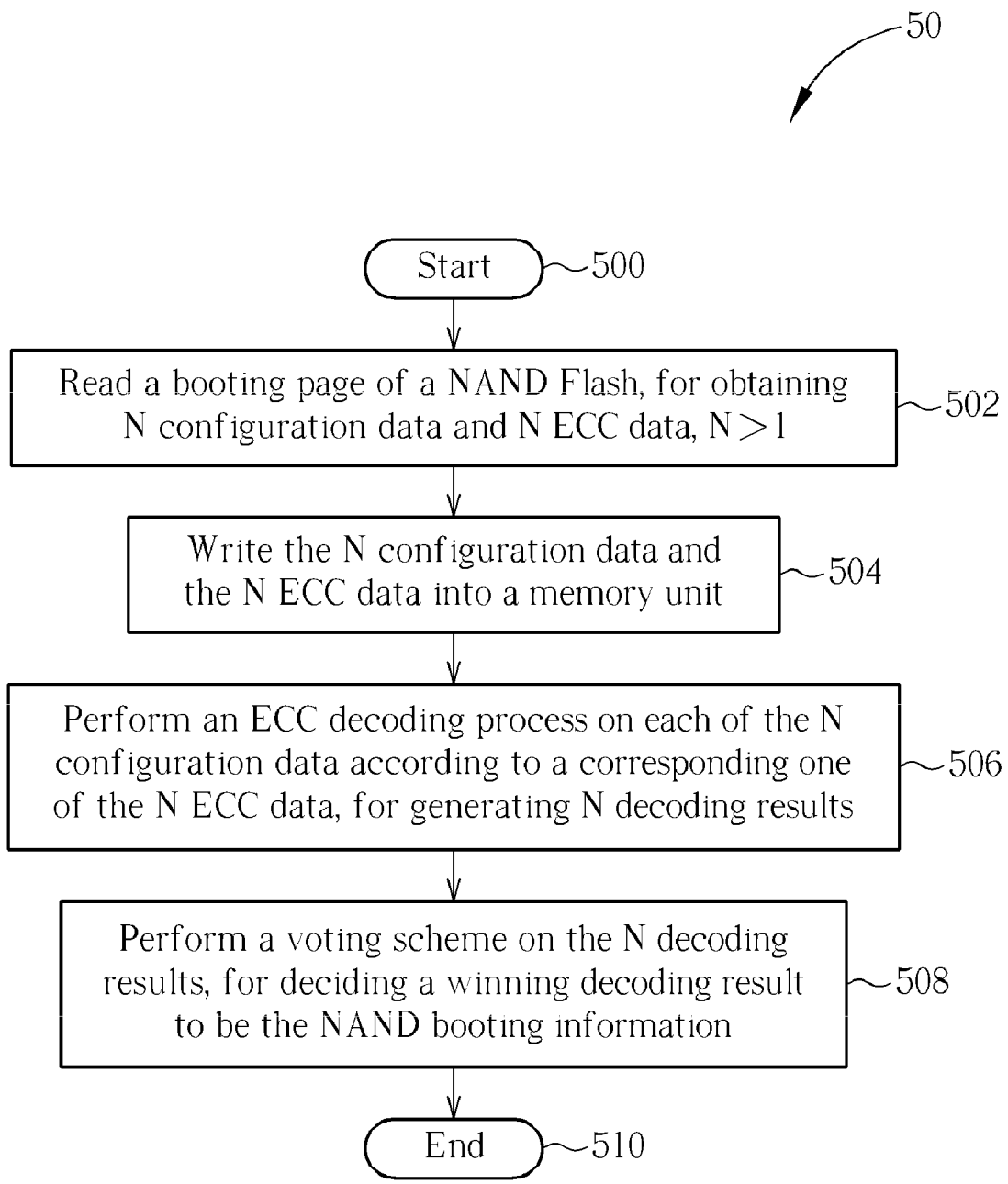

Please refer to FIGS. 3, 4 and 5, which are flowcharts of decoding processes 30, 40 and 50 respectively according to embodiments of the present invention. The decoding process 30 comprises the following steps:

Step 300: Start.

Step 302: Read a booting page of a NAND Flash, for obtaining N configuration data and N ECC data, N>1.

Step 304: Write the N configuration data and the N ECC data into a memory unit.

Step 306: Perform a voting scheme on the N configuration data, for deciding a winning configuration data.

Step 308: Perform an ECC decoding process on the winning configuration data according to each of the N ECC data, for generate a decoding result.

Step 310: Determine whether the decoding result is successful. If yes, the NAND booting information is obtained; otherwise, back to perform step 308.

Step 312: End.

Step 206 in the decoding process 20 can be performed as steps 306 to 310 in the decoding process 30. In the decoding process 30, the system decides a winning configuration data, which is a most possible data to be the NAND booting information, from the N configuration data by the majority voting scheme. Next, the system tries to use each ECC data to decode the winning configuration data and generates the decoding result accordingly. If the decoding result is successful, it means that the used ECC data is exactly the parity for the winning configuration data and can correct the winning configuration data to obtain the NAND booting information. If the decoding result is unsuccessful, it means that the used ECC data is not for the winning configuration data. The system has to perform the ECC decoding process again according to another unused ECC data, until the NAND booting information is obtained.

In addition, the decoding process 40 comprises the following steps:

Step 400: Start.

Step 402: Read a booting page of a NAND Flash, for obtaining N configuration data and N ECC data, N>1.

Step 404: Write the N configuration data and the N ECC data into a memory unit.

Step 406: Perform a voting scheme on the N configuration data, for deciding a winning configuration data.

Step 408: Perform the voting scheme on the N ECC data, for deciding a winning ECC data.

Step 410: Perform an ECC decoding process on the winning configuration data according to the winning ECC data, for obtaining the NAND booting information.

Step 412: End.

Step 206 in the decoding process 20 can be performed as steps 406 to 410 in the decoding process 40. In the decoding process 40, the system performs the majority voting scheme on the N configuration data and on the N ECC data separately, and then performs the ECC decoding process on the winning configuration data according to the winning ECC data. Because the winning configuration data are the most possible to be the NAND booting information and the winning ECC data are the most possible to be the corresponding parity, the system obtains the NAND booting information accordingly.

In addition, the decoding process 50 comprises the following steps:

Step 500: Start.

Step 502: Read a booting page of a NAND Flash, for obtaining N configuration data and N ECC data, N>1.

Step 504: Write the N configuration data and the N ECC data into a memory unit.

Step 506: Perform an ECC decoding process on each of the N configuration data according to a corresponding ECC data of the N ECC data, for generating N decoding results.

Step 508: Perform a voting scheme on the N decoding results, for deciding a winning decoding result to be the NAND booting information.

Step 510: End.

Step 206 in the decoding process 20 can be performed as steps 506 to 508 in the decoding process 50. The most difference from the decoding processes 30 and 40 is that in the decoding process 50, the system performs the ECC decoding process first and performs the majority voting scheme later. After performing the ECC decoding process on each configuration data and generating the N decoding results, the system performs the majority voting scheme on the N decoding results and decides a winning decoding result that is exactly the NAND booting information.

Using the encoding process 60, the system maximizes the ECC bits for an MLC NAND Flash requiring fewer than the maximum ECC capability. Using the decoding process 20 and other embodiments to obtain the NAND booting information encoded by the encoding process 60, the system saves time for trying iterations of ECC bit number and gets high capability of error correction due to the majority voting scheme. On the other hand, when the system fails to obtain the valid NAND booting information by the decoding processes 20, 30, 40 and 50, it means that the system possibly uses wrong booting information except ECC bit number, such as settings of the page size and the address cycle. In this situation, the system changes the setting of the page size or the address cycle and tries to obtain the valid NAND booting information.

Before the step of reading the booting page in the decoding processes 20, 30, 40 and 50, the system has to disable an ECC scheme used for the booting page, so that the majority voting scheme and the ECC encoding process can be performed successfully. In addition, for an MLC NAND Flash, the parity is usually implemented by a BCH (Bose-Chaudhuri-Hocquenghem) algorithm.

Figure 6:
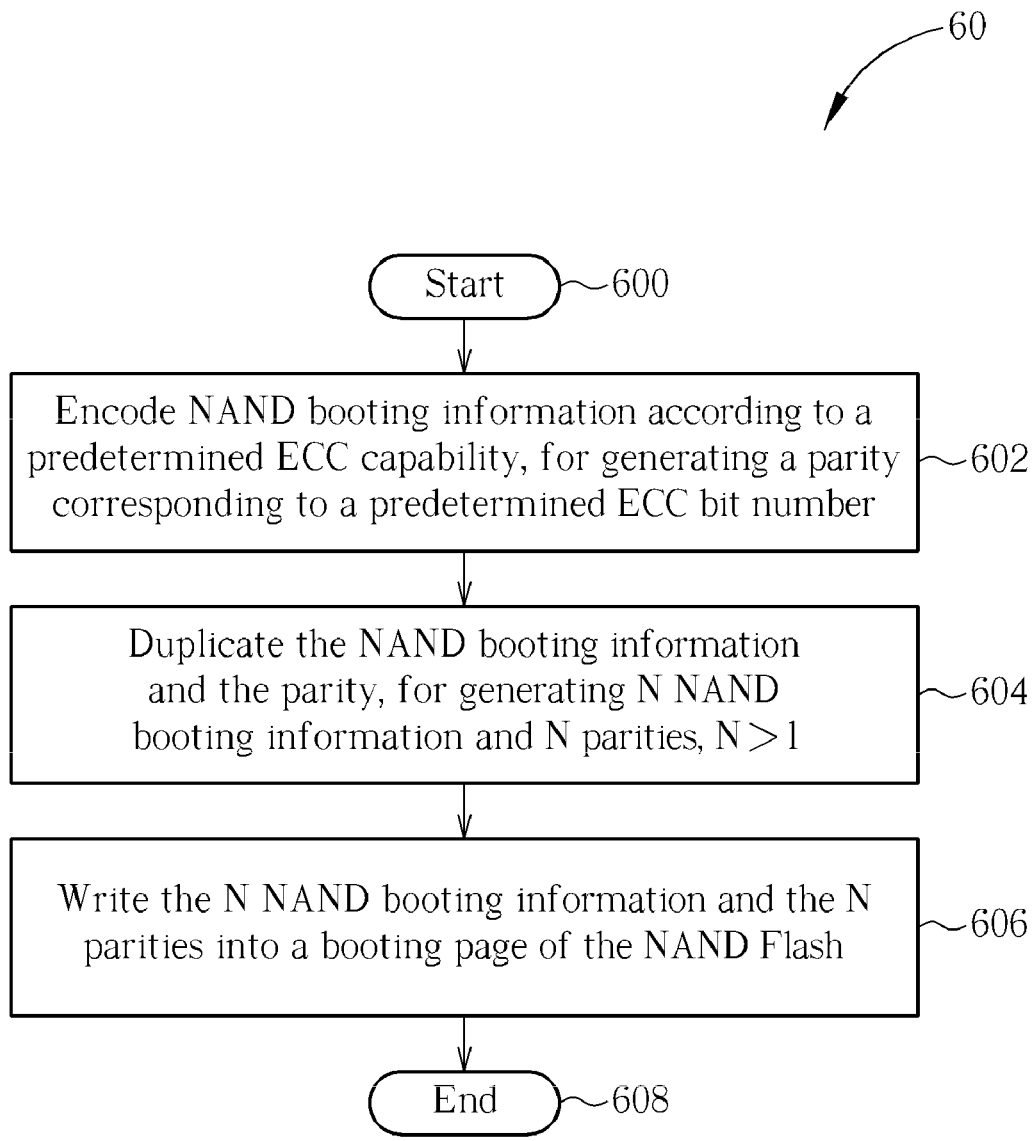
FIG. 6 is a flowchart of an encoding process according to an embodiment of the present invention.

The encoding process 60 is described as follows. Please refer to the FIG. 6, which is a flowchart of the encoding process 60 according to an embodiment of the present invention. The encoding process 60 is utilized for generating a corresponding parity for the NAND booting information and writing the NAND booting information into the NAND Flash. The encoding process 60 comprises the following steps:

Step 600: Start.

Step 602: Encode NAND booting information according to a predetermined ECC capability, for generating a parity corresponding to a predetermined ECC bit number.

Step 604: Duplicate the NAND booting information and the parity, for generating N NAND booting information and N parities, N>1.

Step 606: Write the N NAND booting information and the N parities into a booting page of the NAND Flash.

Step 608: End.

First, the system encodes the NAND booting information according to the predetermined ECC capability, for example, a maximum ECC capability, for generating the parity corresponding to the predetermined ECC bit number, which is the largest number according to the maximum ECC capability. Therefore, the NAND booting information can be protected by the maximum ECC capability. Next, the system duplicates the NAND booting information and the parity, for generating the N NAND booting information and the N parities, and writes the N NAND booting information and the N parities into the booting page of the NAND Flash. In one embodiment, in step 606, each NAND booting information is followed by the corresponding parity, in order. But in another embodiment, the parity could be saved at a desired position previous than the NAND booting information. The number of duplicates depends on the page size.

Figure 7:
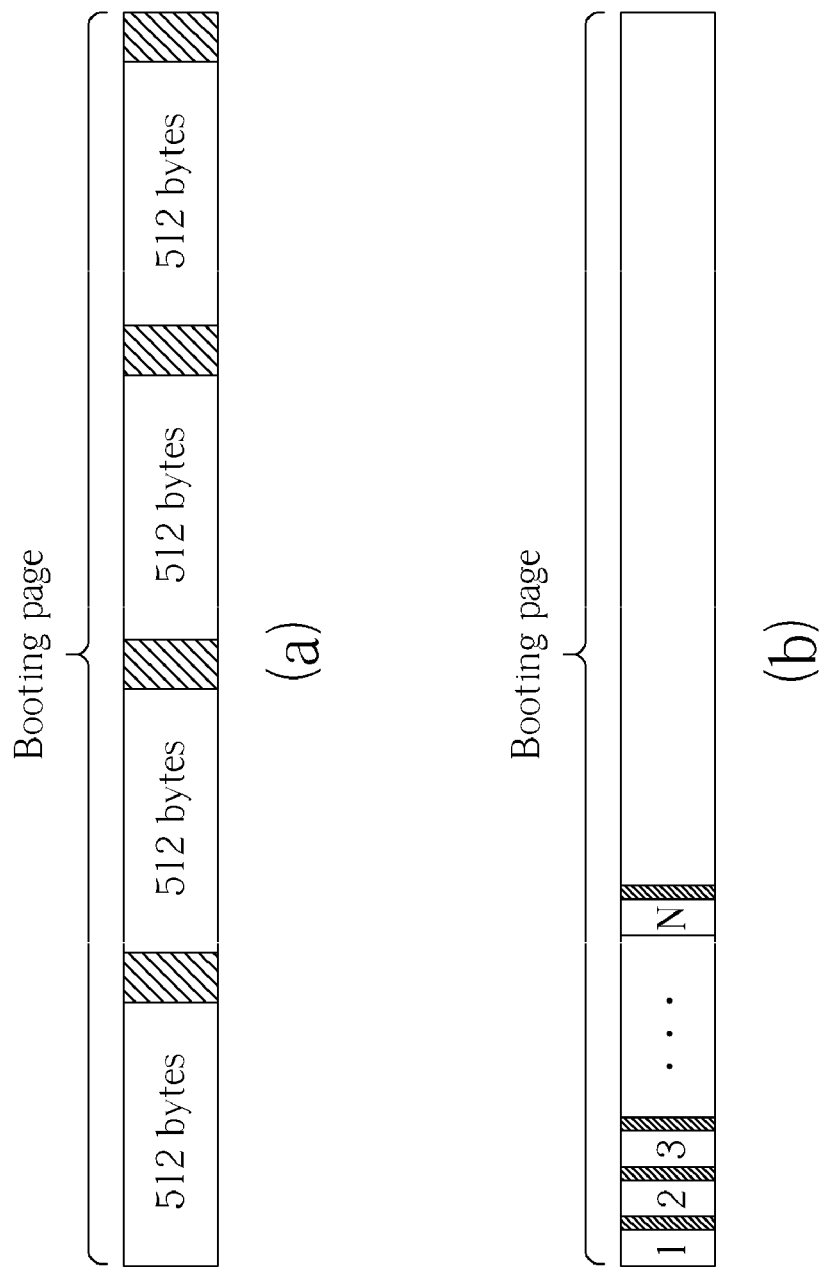
FIG. 7 is a diagram of ECC parity allocation according to the encoding process shown in FIG. 6 compared with a conventional ECC parity allocation.

Please further refer to FIG. 7, which is a diagram of ECC parity allocation according to the encoding process 60 compared with a conventional ECC parity allocation. FIG. 7(a) shows a conventional ECC parity allocation, while FIG. 7(b) shows an ECC parity allocation according to the encoding process 60. As shown in FIG. 7(a), the system can only check the parity stored in the spare area (slash area in the diagram) after reading a 512-bytes data area. In comparison, the system writes N duplicates of the NAND booting information and the corresponding parity (slash area in the diagram) to the NAND Flash, and performs the majority voting scheme according to the decoding process 20, so that the capability of error correction is enhanced.

By the verification, the embodiments of the present invention protects against error even though there are more than 30 percent of the NAND booting information corrupted. Therefore, the embodiments of the present invention provide a high capability of error correction. In addition, the embodiments of the present invention maximize the ECC bit number for a MLC NAND Flash that requires fewer than the maximum ECC capability.

Figure 8:
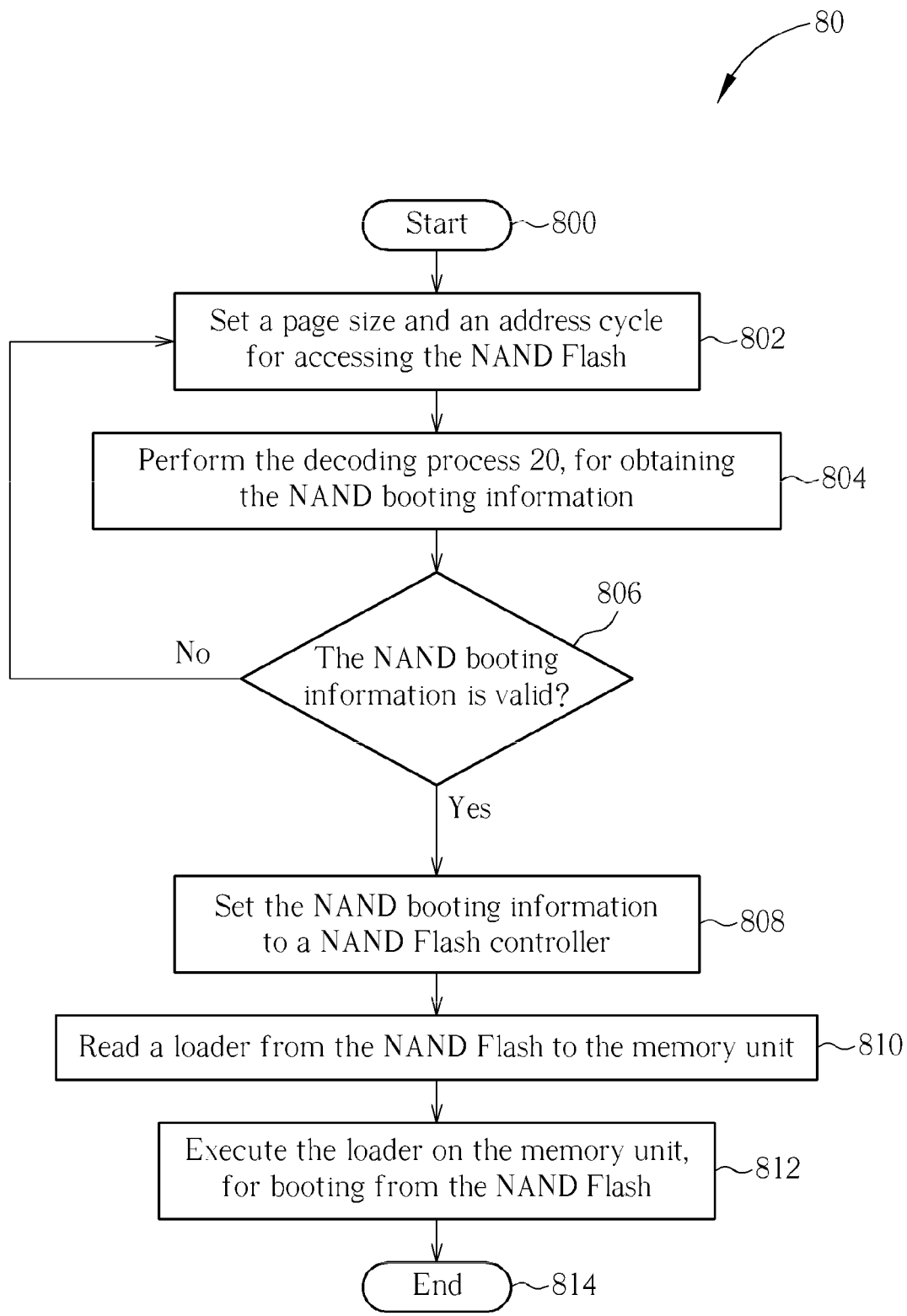
FIG. 8 is a flowchart of a booting process according to an embodiment of the present invention.

The decoding processes 20, 30, 40 and 50 are used for obtaining the NAND booting information, and each is certainly used for a complete booting process. Please refer to FIG. 8, which is a flowchart of a booting process 80 according to an embodiment of the present invention. The booting process 80 comprises the following steps:

Step 800: Start.

Step 802: Set a page size and an address cycle for accessing the NAND Flash.

Step 804: Perform the decoding process 20, for obtaining the NAND booting information.

Step 806: Check validation of the NAND booting information. If the NAND booting information is valid, perform step 808; otherwise, back to perform step 802 to change setting of the page size and the address cycle.

Step 808: Set the NAND booting information to a NAND Flash controller.

Step 810: Read a loader from the NAND Flash to the memory unit.

Step 812: Execute the loader on the memory unit, for booting from the NAND Flash.

Step 814: End.

In the booting process 80, the NAND flash stores data generated by the encoding process 60. First, the system sets the page size and the address cycle for accessing the NAND Flash, and performs the decoding process 20 for obtaining the NAND booting information. Note that the decoding process 20 can also be replaced by the decoding process 30, 40 or 50. Detailed operations of these decoding processes are described previously and are not given here. When the NAND booting information is obtained, the system checks whether the NAND booting information is valid. The system will perform a loop composed of steps 802, 804 and 806 until the NAND booting information is valid. Next, the system sets the valid NAND booting information to the NAND Flash controller and reads the loader from the NAND Flash to the memory unit, a RAM memory, so that the system executes the loader on the memory unit and finally boots from the NAND Flash.

Figure 9:
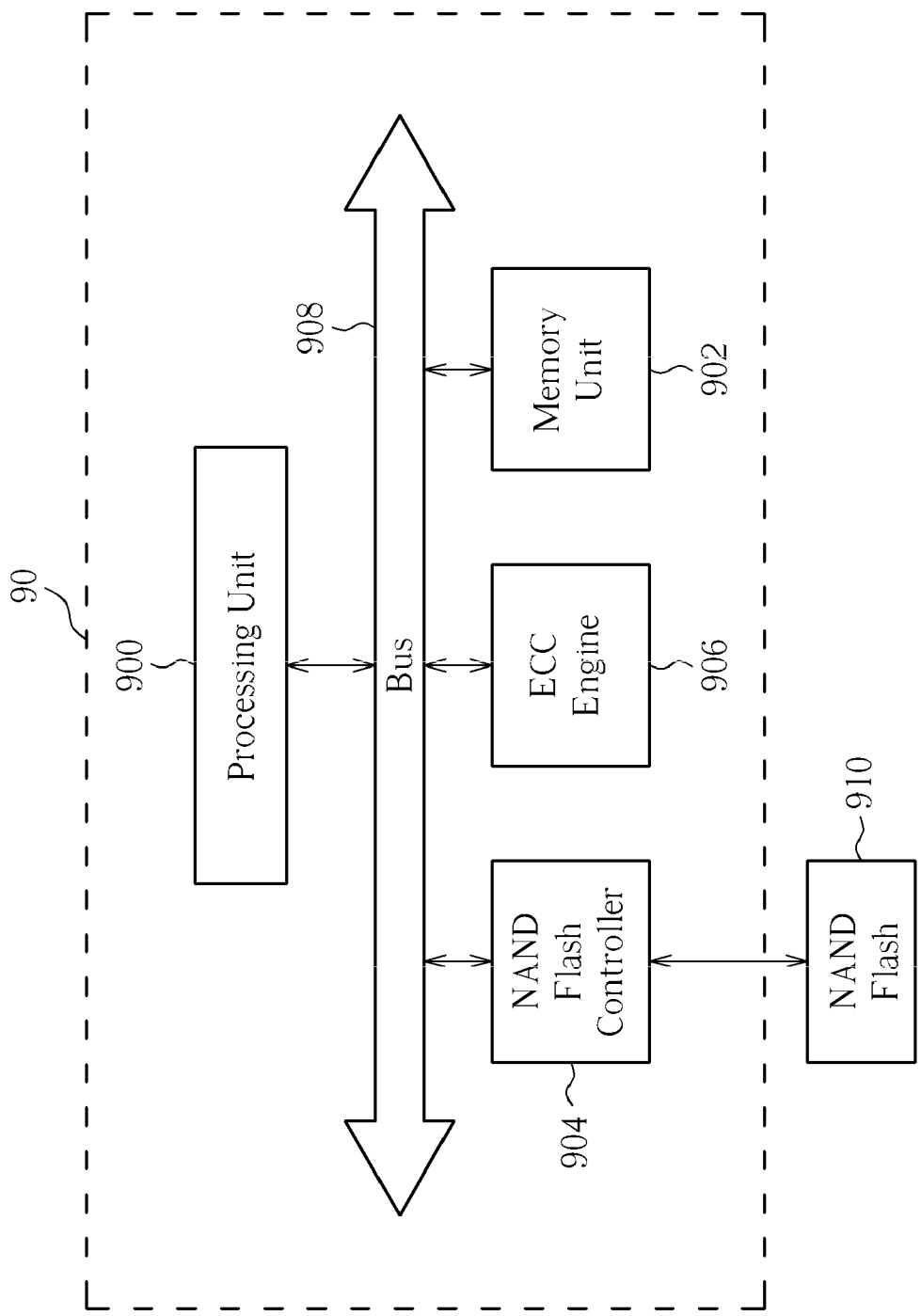
FIG. 9 is a schematic diagram of a boot control system according to an embodiment of the present invention.

Furthermore, anyone of the decoding processes 20, 30, 40 and 50 and the booting process 80 can be implemented in a boot control system 90. Please refer to FIG. 9 for a schematic diagram of the boot control system 90 according to an embodiment of the present invention. The boot control system 90 is utilized for booting from a NAND Flash 910, which includes a booting page storing NAND booting information generated by the encoding process 60. The boot control system 90 comprises a processing unit 900, a memory unit 902, a NAND Flash controller 904 and an ECC engine 906, and the above units of the boot control system 90 communicate via a bus 908.

The boot control system 90 implements the decoding process 20 and the booting process 80. The processing unit 900 is utilized for performing steps of setting the page size and the address cycle for accessing the NAND Flash (step 802), performing a voting scheme on the N configuration data and the N ECC data (step 206), checking validation of the NAND booting information (step 806), changing setting of the page size and the address cycle when the NAND booting information is invalid (back to step 802 when the result of step 806 is invalid), setting the valid NAND booting information to the NAND Flash controller 904 (step 808), and executing a loader on the memory unit 902, for booting from the NAND Flash 910 (step 812). The memory unit 902 is an XIP memory such as a RAM memory, coupled to the processing unit 900 and the NAND Flash controller 904, and utilized for storing the N configuration data and the N ECC data. In other embodiments of the present invention, the memory unit 902 can be independent of the ECC engine 906, and can also be formed in the ECC engine 906 when the ECC engine 906 has an internal buffer enough for storing the NAND booting information.

The NAND Flash controller 904 is coupled to the processing unit 900, the memory unit 902 and the NAND Flash 910, and is utilized for performing steps of reading the booting page, for obtaining the N configuration data and the N ECC data (step 202), writing the N configuration data and the N ECC data into the memory unit 902 (step 204), and reading the loader from the NAND Flash 910 to the memory unit 902 (step 810). The ECC engine 906 is coupled to the processing unit 900, the memory unit 902 and the NAND Flash controller 904, and is utilized for performing an ECC decoding process, for obtaining the NAND booting information (step 206).

In a brief, the NAND Flash controller 904 controls read/write actions to the NAND Flash 910. The processing unit 900 and the ECC engine 906 cooperate to perform the voting scheme and the ECC decoding process until the valid NAND booting information is obtained. And finally, all units of the boot control system 90 cooperate to boot from the NAND Flash 910. For the variation embodiments of the boot control system 90, please refer to the decoding processes 30, 40, and 50, which describes different operations of the processing unit 900 and the ECC engine 906.

In conclusion, according to embodiments of the present invention, the decoding processes enhance the capability of error correction by the voting scheme, and the encoding process maximizes the ECC bits, so that the booting process and the boot control device using the decoding process and the encoding process enhance efficiency for booting from the NAND Flash.

Those skilled in the art will readily observe that numerous modifications and alterations of the device and method may be made while retaining the teachings of the invention.

What is claimed is:

1. A decoding method for booting from a NAND Flash comprising a booting page storing a plurality of copies of NAND booting information and a plurality of corresponding parities, each parity generated by a predetermined error correction code (ECC) bit number, the decoding method comprising:

reading the booting page, for obtaining a plurality of configuration data and a plurality of ECC data; and performing a voting scheme and an ECC decoding process on the plurality of configuration data and the plurality of ECC data, for obtaining the NAND booting information.

2. The decoding method of claim 1, further comprising disabling an ECC scheme used for the booting page before the step of reading the booting page.

3. The decoding method of claim 1, further comprising writing the plurality of configuration data and the plurality of ECC data into a memory unit after the step of reading the booting page.

4. The decoding method of claim 1, wherein the voting scheme is a majority voting scheme.

5. The decoding method of claim 1, wherein the step of performing the voting scheme and the ECC decoding process on the plurality of configuration data and the plurality of ECC data, for obtaining the NAND booting information comprising:

performing the voting scheme on the plurality of configuration data, for deciding a winning configuration data; and performing the ECC decoding process on the winning configuration data according to each of the plurality of ECC data until the NAND booting information is obtained.

6. The decoding method of claim 1, wherein the step of performing the voting scheme and the ECC decoding process on the plurality of configuration data and the plurality of ECC data, for obtaining the NAND booting information comprising:

performing the voting scheme on the plurality of configuration data, for deciding a winning configuration data;

performing the voting scheme on the plurality of ECC data, for deciding a winning ECC data; and performing the ECC decoding process on the winning configuration data according to the winning ECC data, for obtaining the NAND booting information.

7. The decoding method of claim 1, wherein the step of performing the voting scheme on the plurality of NAND booting information and the corresponding plurality of parities for obtaining the correct NAND booting information comprising:

performing the ECC decoding process on each of the plurality of configuration data according to a corresponding ECC data of the plurality of ECC data, for generating a plurality of decoding results; and performing the voting scheme on the plurality of decoding results, for deciding a winning decoding result to be the NAND booting information.

8. The decoding method of claim 1, wherein the step of performing the voting scheme and the ECC decoding process on the plurality of configuration data and the plurality of ECC data, for obtaining the NAND booting information comprising:

performing the voting scheme on the plurality of configuration data, for deciding a winning configuration data; and performing the ECC decoding process on the winning configuration data according to at least one of the plurality of ECC data, for obtaining the NAND booting information.

9. An encoding method for a NAND Flash comprising:

encoding NAND booting information according to a predetermined error correction code (ECC) capability, for generating a parity of a predetermined ECC bit number;

duplicating the NAND booting information and the parity, for generating a plurality of NAND booting information and a plurality of parities; and writing the plurality of NAND booting information and the plurality of parities into a booting page of the NAND Flash.

10. A boot control system for booting from a NAND Flash including a booting page storing a plurality of copies of NAND booting information and a plurality of parities, each parity corresponding to the NAND booting information and corresponding to a predetermined error correction code (ECC) bit number, the boot control system comprising:

a NAND flash controller, coupled to the NAND flash, for reading the booting page to obtain a plurality of configuration data and a plurality of ECC data; and a processing unit, coupled to the NAND flash controller, for performing a voting scheme and controlling an ECC engine to perform an ECC decoding process on the plurality of configuration data and the plurality of ECC data to obtain the NAND booting information.

11. The boot control system of claim 10, wherein the processing unit further disables the ECC engine used for the booting page before the NAND Flash controller reads the booting page.

12. The boot control system of claim 10, further comprising a memory unit, coupled to the processing unit the NAND Flash controller, for storing the plurality of configuration data and the plurality of ECC data.

13. The boot control system of claim 12, wherein the memory unit is independent of the ECC engine.

14. The boot control system of claim 12, wherein the memory unit is formed in the ECC engine.

15. The boot control system of claim 12, wherein the NAND Flash controller further writes the plurality of configuration data and the plurality of ECC data into the memory unit after reading the booting page.

16. The boot control system of claim 10, wherein the voting scheme is a majority voting scheme.

17. The boot control system of claim 10, wherein after the processing unit performs the voting scheme on the plurality of configuration data for deciding a winning configuration data, the ECC engine performs the ECC decoding process on the winning configuration data according to each of the plurality of ECC data until the NAND booting information is obtained.

18. The boot control system of claim 10, wherein after the processing unit performs the voting scheme on the plurality of configuration data for deciding a winning configuration data and performs the voting scheme on the plurality of ECC data for deciding a winning ECC data, the ECC engine performs the ECC decoding process on the winning configuration data according to the winning ECC data, for obtaining the NAND booting information.

19. The boot control system of claim 10, wherein after the ECC engine unit performs the ECC decoding process on each of the plurality of configuration data according to a corresponding one of the plurality of ECC data, for generating a plurality of decoding result, the processing unit performs the voting scheme on the plurality of decoding results, for deciding a decoding result to be the NAND booting information.

20. The boot control system of claim 10, wherein after the processing unit performs the voting scheme on the plurality of configuration data for deciding a winning configuration data, the ECC engine performs the ECC decoding process on the winning configuration data according to at least one of the plurality of ECC data for obtaining the NAND booting information.

* * * * *